(12) United States Patent
Shibuya

(10) Patent No.: US 8,243,462 B2
(45) Date of Patent: Aug. 14, 2012

(54) PRINTED WIRING BOARD, SEMICONDUCTOR DEVICE, AND METHOD FOR MANUFACTURING PRINTED WIRING BOARD

(75) Inventor: Koujirou Shibuya, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 221 days.

(21) Appl. No.: 12/801,834

(22) Filed: Jun. 28, 2010

(65) Prior Publication Data

US 2011/0019379 A1    Jan. 27, 2011

(30) Foreign Application Priority Data

Jul. 22, 2009    (JP) .................................. 2009-171638

(51) Int. Cl.
*H05K 7/00*    (2006.01)
*H01L 23/48*    (2006.01)

(52) U.S. Cl. ........ 361/760; 361/783; 257/690; 257/692; 257/693

(58) Field of Classification Search ........................ None
See application file for complete search history.

(56) References Cited

U.S. PATENT DOCUMENTS

| | | | | |
|---|---|---|---|---|
| 5,293,067 | A * | 3/1994 | Thompson et al. | 257/668 |
| 5,591,941 | A * | 1/1997 | Acocella et al. | 174/266 |
| 5,969,426 | A * | 10/1999 | Baba et al. | 257/778 |
| 6,144,091 | A * | 11/2000 | Washida | 257/693 |
| 6,308,938 | B1 * | 10/2001 | Futakuchi | 257/780 |
| 6,822,317 | B1 * | 11/2004 | Inoue et al. | 257/668 |
| 8,035,202 | B2 * | 10/2011 | Watanabe et al. | 257/635 |

FOREIGN PATENT DOCUMENTS

JP    2-268483 A    11/1990

* cited by examiner

*Primary Examiner* — Boris Chervinsky
(74) *Attorney, Agent, or Firm* — McGinn IP Law Group, PLLC

(57) ABSTRACT

A printed wiring board includes a plurality of lands arranged in a mounting area allowing therein mounting of an electronic component; and an wiring respectively connected to a specific land which is at least one of the outermost lands arranged outermostly out of all lands, wherein a connection portion of the specific land and the wiring connected to the specific land is positioned inside a closed curve which collectively surrounds, by the shortest path, all of the outermost lands formed in the mounting area.

9 Claims, 8 Drawing Sheets

PRINTED WIRING BOARD, SEMICONDUCTOR DEVICE, AND METHOD FOR MANUFACTURING PRINTED WIRING BOARD

This application is based on Japanese patent application No. 2009-171638 the content of which is incorporated hereinto by reference.

BACKGROUND

1. Technical Field

The present invention relates to a printed wiring board, a semiconductor device, and a method for manufacturing a printed wiring board.

2. Background Art

Electronic components such as semiconductor chip or semiconductor package are incorporated into various electronic instruments, and have increasingly been reduced in size and weight in recent years. In particular, electronic components to be incorporated into portable instruments such as mobile phone are required to be excellent in reliability after being mounted on printed wiring board, in terms of temperature cycle resistance, resistance against bending of board, impact resistance and so forth.

Japanese Laid-Open Patent Publication No. 2-268483 discloses a structure having a connection portion of a through-hole land and an interconnect, formed wider than the width of interconnect. According to the description of this publication, disconnection at land may be avoidable even if positional accuracy of the through-hole should degrade to some degree.

SUMMARY

The present inventor has recognized as follows. It is difficult for the technique disclosed in Japanese Laid-Open Patent Publication No. 2-268483 to prevent damages (disconnection of interconnects, cracking, and so forth) from occurring at wirings which are drawn out from the lands outermostly arranged in a mounting area for semiconductor package or other electronic components, ascribable to stress applied to the printed wiring board.

In one embodiment, there is provided a printed wiring board which includes: a plurality of lands arranged in a mounting area allowing therein mounting of an electronic component; and an wiring respectively connected to a specific land which is at least one of the outermost lands arranged outermostly out of the lands. A connection portion of the specific land and the wiring connected to the specific land is positioned inside a closed curve which collectively surrounds, by the shortest path, all of the outermost lands formed in the mounting area.

The present inventor has recognized as follows. On a printed wiring board, a portion where thermal stress or mechanical stress may most heavily be concentrated is a portion in the vicinity of a closed curve which collectively surrounds, by the shortest path, all of the outermost lands formed in the mounting area, and in particular in a portion along the outer circumferences of the outermost lands.

According to the embodiment, since the connection portion of at least one of the outermost lands and the wiring is positioned inside a closed curve which collectively surrounds, by the shortest path, all of the outermost lands formed in the mounting area, so that the wiring may no longer necessarily be disposed at the portion where the thermal stress or mechanical stress may most heavily be concentrated. Accordingly, the wiring connected to the specific land may be suppressed from being damaged (such as causing disconnection of interconnect, or cracking).

In another embodiment, there is provided a semiconductor device which includes: a printed wiring board including: a plurality of lands arranged in a mounting area allowing therein mounting of an electronic component; and an wiring respectively connected to a specific land which is at least one of the outermost lands arranged outermostly out of said lands, a connection portion of said specific land and said wiring connected to said specific land is positioned inside a closed curve which collectively surrounds, by the shortest path, all of said outermost lands formed in said mounting area; and a semiconductor chip or a semiconductor package as said electronic component connected to said plurality of lands in said mounting area.

In yet another embodiment, there is provided a method for manufacturing a printed wiring board which includes forming a plurality of lands on a printed wiring board arranged in a mounting area allowing therein mounting of an electronic component, and forming an wiring respectively connected to a specific land which is at least one of the outermost lands arranged outermostly out of the lands, wherein the forming an wiring, the wiring is formed so that a connection portion of the specific land and the wiring connected to the specific land is positioned inside a closed curve which collectively surrounds, by the shortest path, all of the outermost lands formed in the mounting area.

According to the embodiment, the wiring connected to the land, arranged outermostly in the mounting area of the electronic component may be suppressed from being damaged (such as causing disconnection of interconnect, or cracking).

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Before describing of the present invention, the related art will be explained in detail with reference to FIG. 6 to FIG. 8 in order to facilitate the understanding of the present invention.

Figure 6:
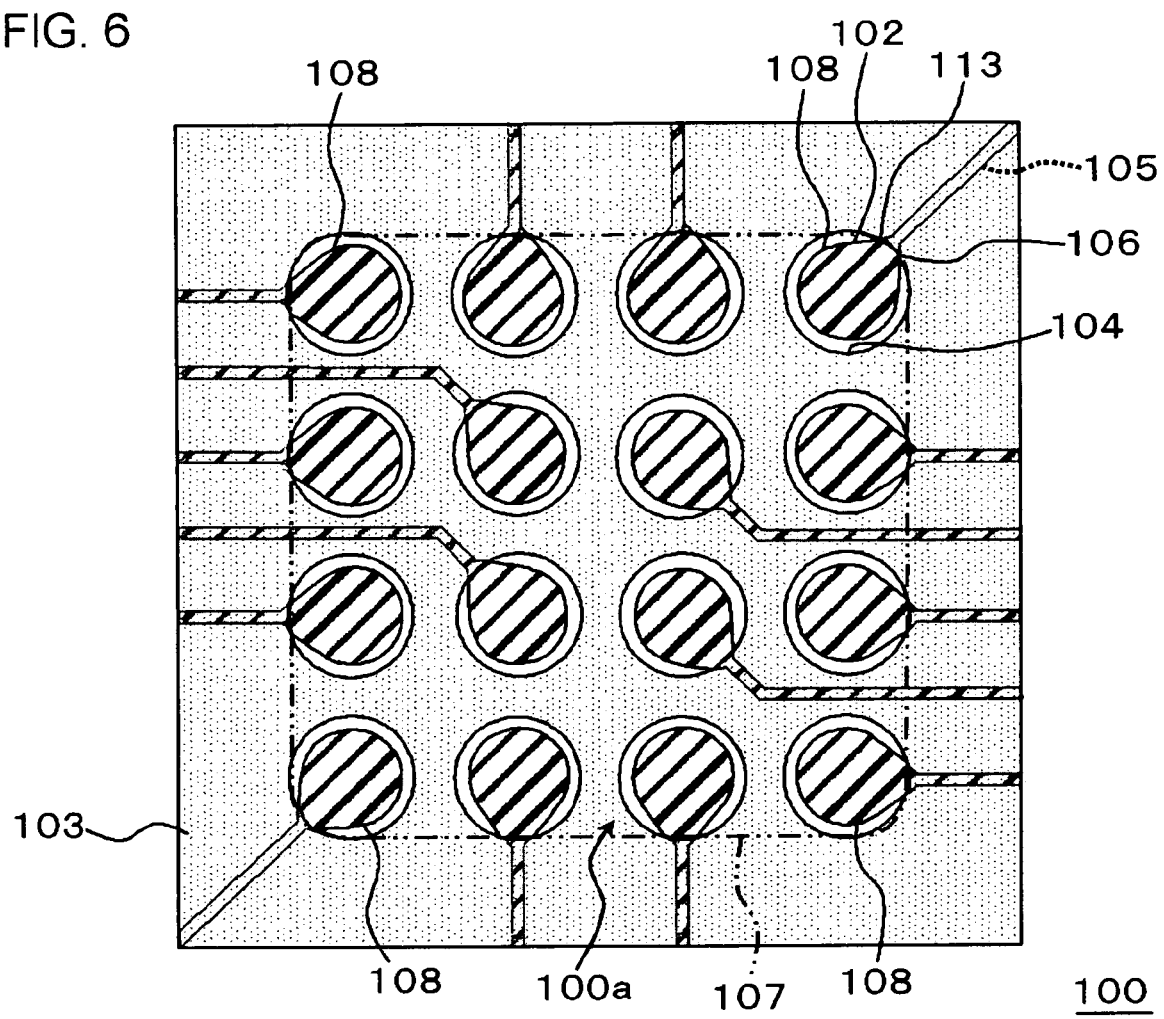
FIG. 6 is a plan view illustrating a printed wiring board of a comparative example.

FIG. 6 is a plan view illustrating a printed wiring board 100 of a comparative example, representing a mounting area 100a and interconnect pattern therearound, in a semiconductor package such as BGA (Ball Grid Array) package 109 (see FIG. 7) or LGA (Land Grid Array) package (not illustrated).

Figure 7:
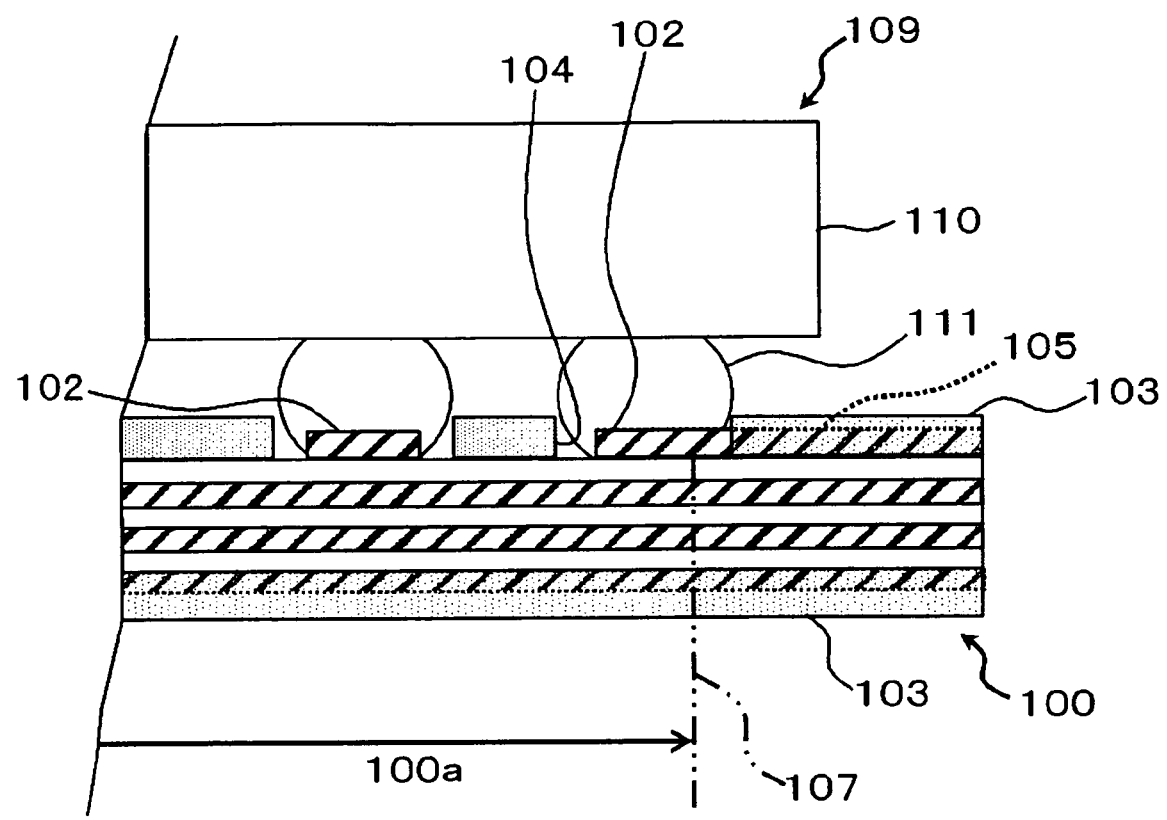
FIG. 7 is a sectional view illustrating a semiconductor device of a comparative example.

FIG. 7 is a sectional view illustrating a state of the printed wiring board 100 illustrated in FIG. 6, having the BGA package 109 mounted thereon by soldering (reflow mounting).

As illustrated in FIG. 6, the printed wiring board 100 has a plurality of lands 102 arranged thereon corresponding to a layout of terminals of a semiconductor package to be mounted on the printed wiring board 100. More specifically, a mounting area 100a has a plurality of lands 102 arranged therein.

The printed wiring board 100 has a solder resist layer 103 formed on the surface thereof. Each land 102 has an NSMD (No Solder Mask Defined) structure. More specifically, in the solder resist layer 103, solder resist openings 104 are formed at positions respectively corresponding to the lands 102, and the individual lands 102 are exposed on the top surface side (the side more closer to the viewer in FIG. 6, and the upper side in FIG. 7) through the solder resist openings 104. Diameter of each solder resist opening 104 is set slightly larger (typically larger by approximately 0.1 to 0.15 mm) than that of the land 102.

From each land 102, an wiring 105 is drawn out, and extended outward from the mounting area 100a.

Out of the individual lands 102 in the mounting area 100a, those outermostly arranged will be referred to as outermost lands hereinafter. Again out of the outermost lands, four lands arranged at the corners of the mounting area 100a will be referred to as corner lands 108 hereinafter. A portion where the wiring 105 drawn out from the outermostly arranged land 102 and the inner circumference of the solder resist opening 104 corresponded to the land 102 cross with each other, will be referred to as an wiring-resist intersection 106 hereinafter.

A land-circumscribing line 107 illustrated in FIG. 6 is a closed curve which collectively surrounds, by the shortest path, all of the outermost lands formed in the mounting area 100a. In other words, the land-circumscribing line 107 may also be understood as a closed curve which collectively surrounds, by the shortest path, the outermost connection portions which are connection portions outermostly arranged, out of all connection portions of the semiconductor package and the printed wiring board 10. Note that the land-circumscribing line 107 is also a boundary line between the mounting area 100a and a region outside thereof.

In the structure illustrated in FIG. 6, each connection portion 113 of each outermostly arranged land 102 and each wiring 105 falls on the land-circumscribing line 107. Also each wiring-resist intersection 106 falls on the land-circumscribing line 107.

As illustrated in FIG. 7, the BGA package 109 has a body portion 110, and solder balls 111 respectively provided to terminals (not illustrated) of the body portion 110. In the state illustrated in FIG. 7, by heating the solder balls 111 on the BGA package 109 at or above the melting point thereof so as to cause reflow, the solder balls 111 are soldered onto the lands 102, and thereby the BGA package 109 is mounted by soldering onto the printed wiring board 100. For more details, in this state, the solder balls 111 are fused with solder paste (not illustrated) printed on the lands 102.

Since the printed wiring board 100 and the semiconductor package (illustrated as the BGA package 109 in FIG. 7), after the above-described mounting by soldering, may be exposed to various environments, so that the terminals of the semiconductor package may be applied typically with thermal stress or mechanical stress.

In general, the printed wiring board 100 has a thermal expansion coefficient larger than that of the semiconductor package. Since the semiconductor package and the printed wiring board 100 are bonded with each other at the positions of the individual lands 102 in the mounting area 100a, so that warping of the printed wiring board 100 may be limited by the contribution of the semiconductor package having a thermal expansion coefficient smaller than that of the printed wiring board 100. However, the limitation is not effected on the region outside the mounting area 100a. As a consequence, a portion of the printed wiring board 100 where the thermal stress may most heavily be concentrated resides in a portion along the outer circumferences of the outermost lands 102, out of all portions in the vicinity of the land-circumscribing line 107 which is the boundary between the mounting area 100a and the region outside thereof. More particularly, a portion along the inner circumference of the solder resist opening 104 may distinctively be applied with the thermal stress. Still more particularly, portions along the corner lands 108, which are positioned mostly away from the center of the mounting area 100a, out of all outermost lands 102, may distinctively be applied with the thermal stress.

On the other hand, also for the case where the printed wiring board 100 is applied with mechanical stress (tensile stress or compressive stress) typically as a result of dropping, the mechanical stress may most heavily be applied to the portion along the outermost lands 102, out of all portions in the vicinity of the outermost line 107, similarly to the case of thermal stress.

In the printed wiring board 100 configured as illustrated in FIG. 6, each connection portion 113 of each outermost land 102 and each wiring 105 falls on the land-circumscribing line 107. Also each wiring-resist intersection 106 of each wiring 105 connected to each outermost land 102 falls on the land-circumscribing line 107. The wirings 105 connected to the outermost lands 102 extend outward from the mounting area 100a.

Figure 8:
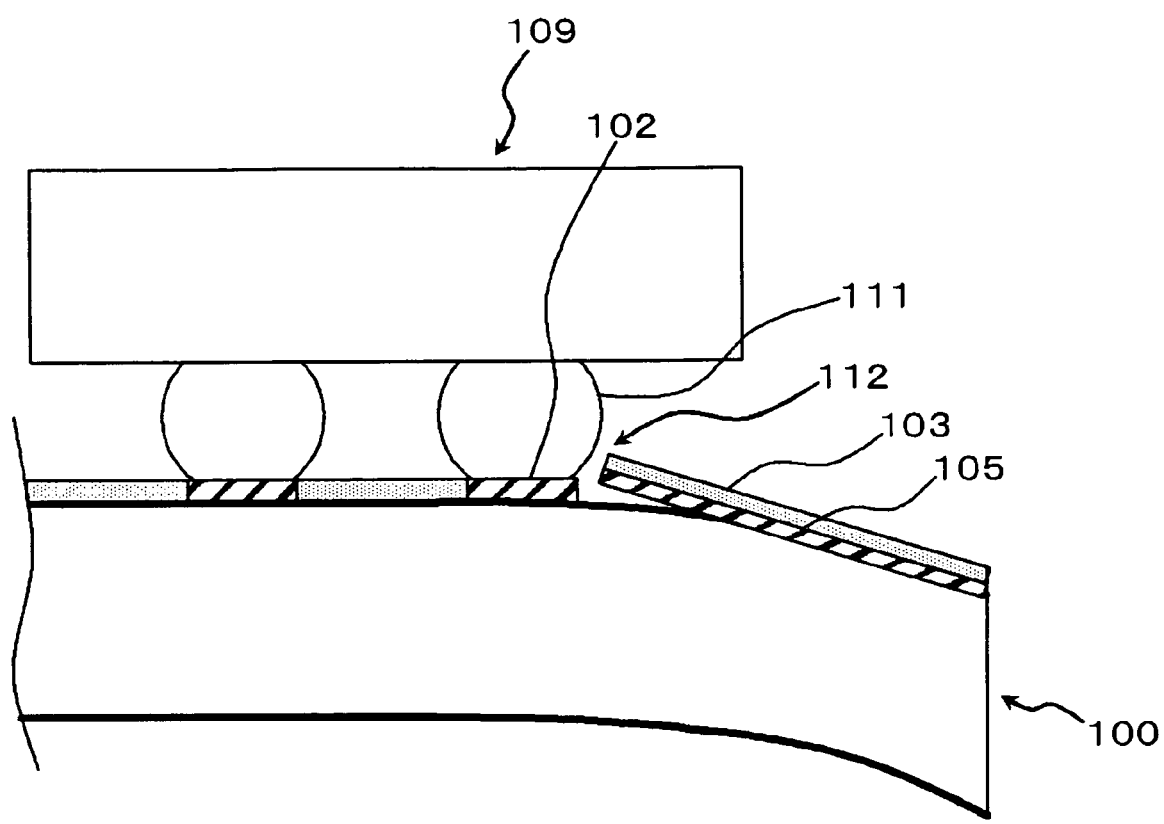
FIG. 8 is a sectional view illustrating a state of disconnection of the wiring of the semiconductor device illustrated in FIG. 7.

Accordingly, the printed wiring board 100 repetitively applied with thermal stress, or applied with a large mechanical stress may cause cracking or disconnection 112 at the connection portion 113 of the outermost land 102 and the wiring 105, or at the wiring-resist intersection 106 on the wiring 105, typically as illustrated in FIG. 8.

As described in the above, the structure illustrated in FIG. 6 has been difficult to suppress damages (disconnection, crack 112 (FIG. 8) and so forth), which possibly occur in the wirings 105 extended from the lands 102 outermostly arranged in the mounting area 100a of a semiconductor package or other electronic components, due to stress applied to the printed wiring board 100. Also the technique described in Japanese Laid-Open Patent Publication No. 2-268483 suffers from the same problem.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained below, referring to the attached drawings. Note that any similar constituents will be given the same reference numerals or symbols in all drawings, and explanations therefor will not be repeated.

[First Embodiment]

Figure 1:
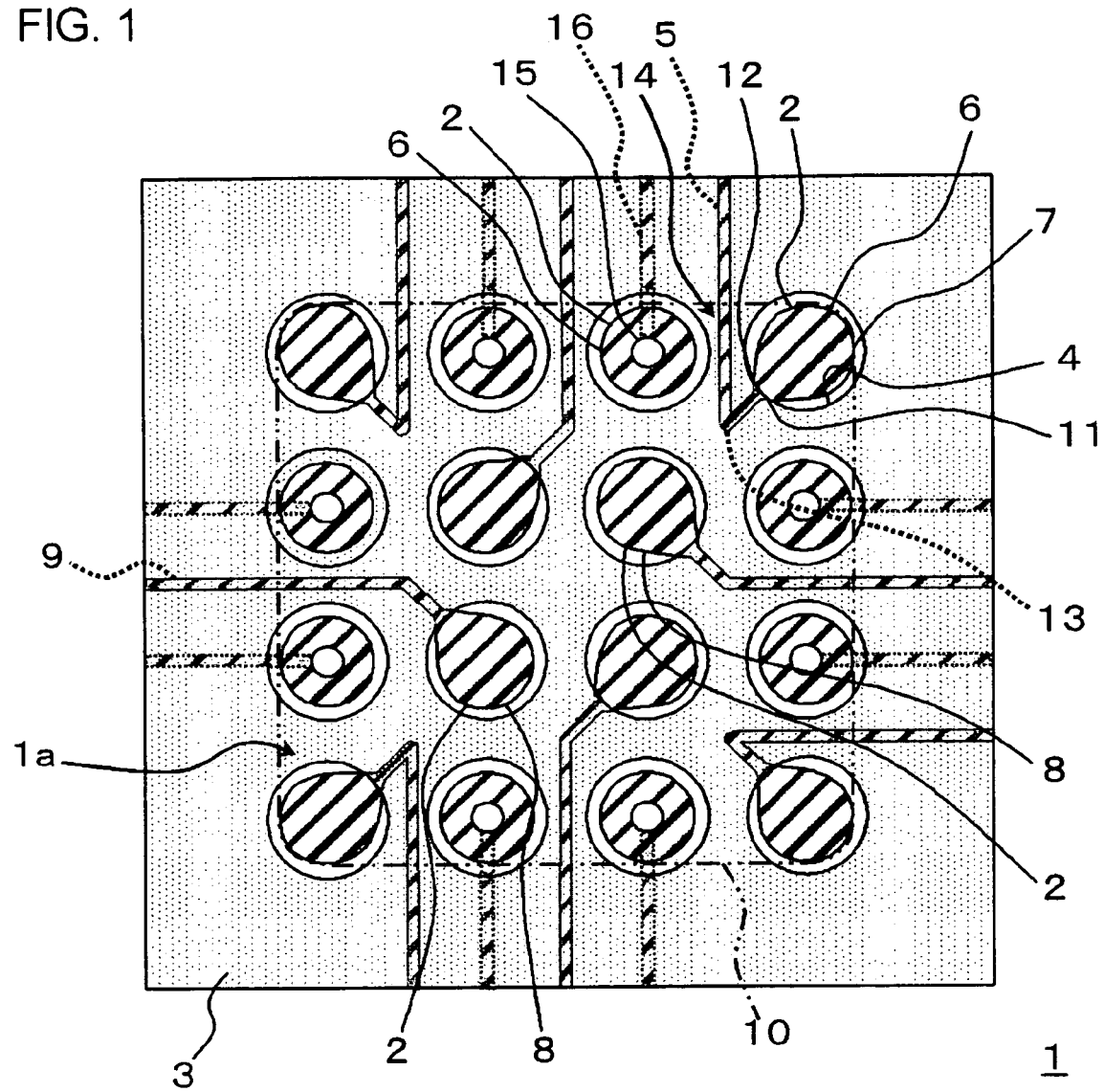
FIG. 1 is a plan view illustrating a printed wiring board of a first embodiment.
Figure 2:
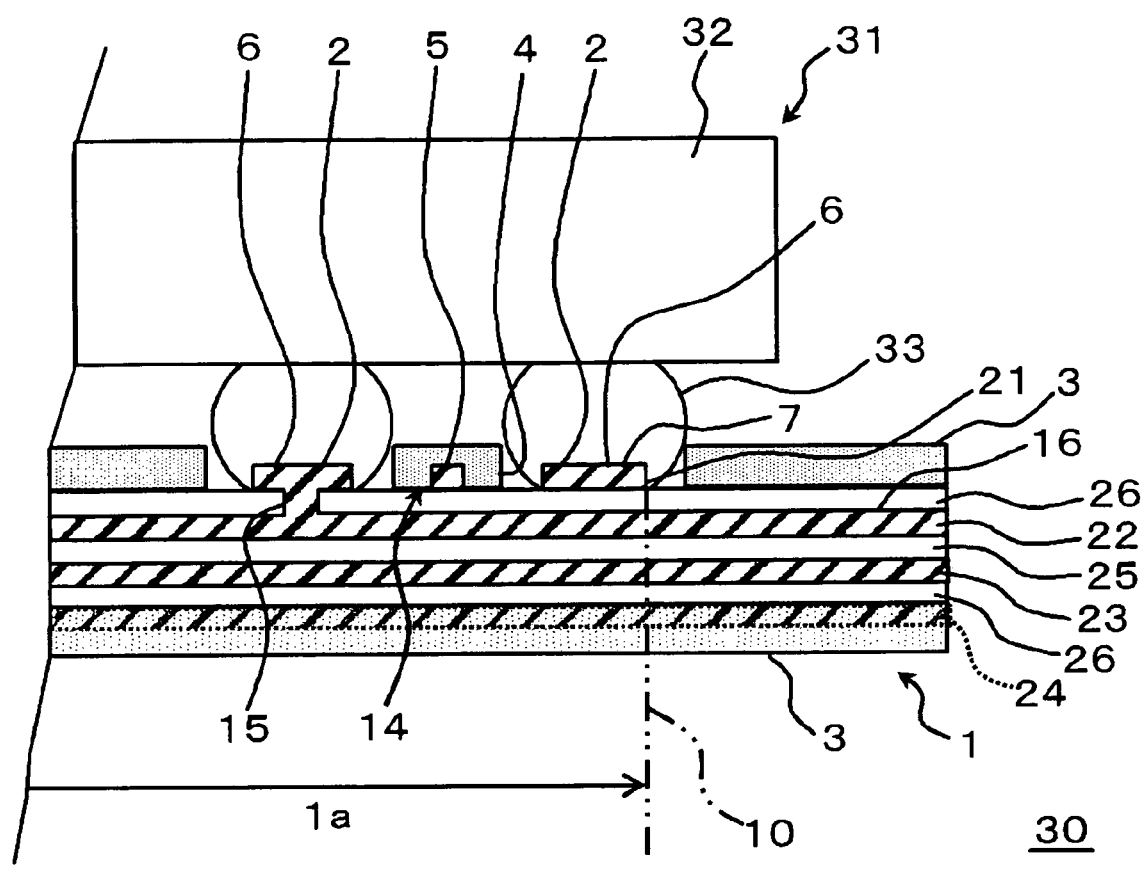
FIG. 2 is a sectional view illustrating a semiconductor device of the first embodiment.

FIG. 1 is a plan view of a printed wiring board 1 according to a first embodiment, and illustrates a mounting area 1a allowing therein mounting of an electronic component, and the region therearound. FIG. 2 is a sectional view of a semiconductor device 30 according to the first embodiment. FIGS. 3A to 3D and FIGS. 4A to 4C are sectional views illustrating a series of steps of manufacturing the printed wiring board according to the first embodiment.

The printed wiring board 1 according to this embodiment has a plurality of lands 2 arranged in the mounting area 1a allowing therein mounting of an electronic component (a semiconductor package 31 (FIG. 2), for example), and wirings 5 respectively connected to at least one specific land (corner lands 7, for example) out of outermost lands 2 which are outermostly arranged ones out of all lands 2. Connection portions 11 of the specific lands and the wirings 5 connected to the specific lands fall inside a closed curve (a land-circumscribing line 10) which collectively surrounds, by the shortest path, all outermost lands 6 formed in the mounting area 1a.

The semiconductor device of this embodiment has the printed wiring board 1 according to this embodiment, and a semiconductor chip or a semiconductor package (semiconductor package 31 (FIG. 2), for example) as an electronic component connected to the plurality of lands 2 in the mounting area 1a.

A method for manufacturing a printed wiring board of this embodiment
includes forming a plurality of lands 2 on a printed wiring board 1 arranged in a mounting area 1a allowing therein mounting of an electronic component, and forming an wiring 5 respectively connected to a specific land which is at least one of the outermost lands 6 (corner lands 7, for example) arranged outermostly out of the lands 2, in the forming an wiring 5, the wiring 5 is formed so that a connection portion of the specific land and the wiring 5 connected to the specific land is positioned inside a closed curve (the land-circumscribing line 10) which collectively surrounds, by the shortest path, all of the outermost lands 6 formed in the mounting area.

Details will be given below.

First, a configuration of the printed wiring board 1 illustrated in FIG. 1 will be explained.

As illustrated in FIG. 1 and FIG. 2, the printed wiring board 1 has a plurality of lands 2 arranged corresponding to a layout of the terminals (not illustrated) of the electronic component (the semiconductor package 31 (FIG. 2), for example) to be mounted on the printed wiring board 1. More specifically, on the printed wiring board 1, a plurality of lands 2 are arranged in the mounting area 1a allowing therein mounting of the electronic component.

In this embodiment, the lands 2 are arranged typically only on one surface of the printed wiring board 1. The lands 2 are typically arranged so as to form a matrix pattern.

The printed wiring board 1 has a solder resist layer 3 on each of the top and back surfaces thereof. The individual lands 2 have an NSMD (No Solder Mask Defined) structure. In other words, in the solder resist layer 3, solder resist openings 4 are formed at positions respectively corresponding to the lands 2, and the individual lands 2 are exposed on the top surface side (the side more closer to an observer in FIG. 1, and the upper side in FIG. 2) in the solder resist openings 4. Diameter of each solder resist opening 4 is set slightly larger (typically larger by approximately 0.1 to 0.15 mm) than that of each land 2.

Note now that the lands 2 outermostly arranged in the mounting area 1a will be referred to as outermost lands 6 hereinafter. Again out from the outermost lands 6, four lands 2 arranged at the corners of the mounting area 1a will be referred to as corner lands 7 hereinafter. In this embodiment, the corner lands 7 are the specific lands. In this embodiment, the outermost lands 6 other than the corner lands 7 are the second specific lands. The lands 2 other than the outermost lands 6 will now be referred particularly to as normal lands 8.

The printed wiring board 1 further has wirings 5, 9 respectively connected to at least one land 2. In this embodiment, for example, an independent wiring 5 is connected to each of the corner lands 7. On the other hand, an independent wiring 9 is connected to each of the normal lands 8.

The land-circumscribing line 10 illustrated in FIG. 1 is a closed curve which collectively surrounds, by the shortest path, all of the outermost lands 6 formed in the mounting area 1a. In other words, the land-circumscribing line 10 may also be understood as a closed curve which collectively surrounds, by the shortest path, the outermost connection portions, which are outermostly-arranged connection portions out of all connection portions of the semiconductor package 31 and the printed wiring board 1. The land-circumscribing line 10 is also the boundary line of the mounting area 1a and the region outside thereof.

Each portion where the wiring 5 drawn out from the corner land 7 and the inner circumference of the solder resist opening 4 corresponded to the corner land 7 cross with each other, will be referred to as an wiring-resist intersection 12 hereinafter.

In this embodiment, the connection portions 11 of the corner lands 7 and the wirings 5 connected to the corner lands 7 fall inside the land-circumscribing line 10. In addition, also the wiring-resist intersections 12 fall inside the land-circumscribing line 10.

Each wiring 5 connected to each corner land 7 is specifically routed, typically so as to originate from the connection portion 11, to run once in the direction away from the land-circumscribing line 10, to be folded back at a folded portion 13, to run through a gap 14 between the corner land 7 and the outermost land 6 adjacent to the corner land 7 (the gap 14 is preferably in the middle position thereof), and to extend outward beyond the land-circumscribing line 10. More specifically, each folded portion 13 typically falls on a middle point of four lands 2 which include one corner land 7 and three lands 2 (two of which are the outermost lands 6, and the residual one is the normal land 8) adjacent to the corner land 7.

The printed wiring board 1 further has vias 15 respectively connected to the outermost lands 6 other than the corner lands 7, and internal wirings 16 respectively connected to the vias 15. The internal wirings 16 are positioned lower than the land 2, and one end of each individual internal wiring 16 is positioned right under the correspondent outermost land 6. The outermost lands 6 other than the corner lands 7 are connected through the vias 15 to the internal wirings 16 right under the outermost lands 6.

The exposed surface of each individual land 2 has an electroless plating 17 (see FIG. 4C) formed thereon, so that the surface is protected by the electroless plating 17.

The printed wiring board 1 has, typically as illustrated in FIG. 2, four metal layers represented by first layer 21 to fourth layer 24. For example, the lands 2 and the wirings 5, 9 are configured by the first layer 21 out of four metal layers, and the internal wiring 16 is configured by the second layer 22 or the third layer 23 (second layer 22, for example).

The printed wiring board 1 further has, typically as illustrated in FIG. 2, a core substrate 25 (typically provided between the second layer 22 and the third layer 23), and a prepreg 26 (independently between the first layer 21 and the second layer 22, and between the third layer 23 and the fourth layer 24, for example).

Next, a configuration of the semiconductor device 30 illustrated in FIG. 2 will be explained.

As illustrated in FIG. 2, the semiconductor device 30 typically has the printed wiring board 1 configured as illustrated in the above, and the semiconductor package 31 connected to the lands 2 of the printed wiring board 1.

The semiconductor package 31 has a body portion 32 having semiconductor elements (not illustrated) incorporated therein, a plurality of terminals (not illustrated) formed on the body portion 32, and solder balls 33 respectively attached to the terminals. The semiconductor package 31 is typically a BGA package.

The individual lands 2 of the printed wiring board 1 are respectively corresponded to the individual terminals of the semiconductor package 31.

The individual terminals of the semiconductor package 31 are respectively connected through the solder balls 33 to the correspondent lands 2 of the printed wiring board 1.

Next, as an exemplary method for manufacturing a printed wiring board of this embodiment, a method for manufacturing a general build-up board will be explained below.

Figure 3A:
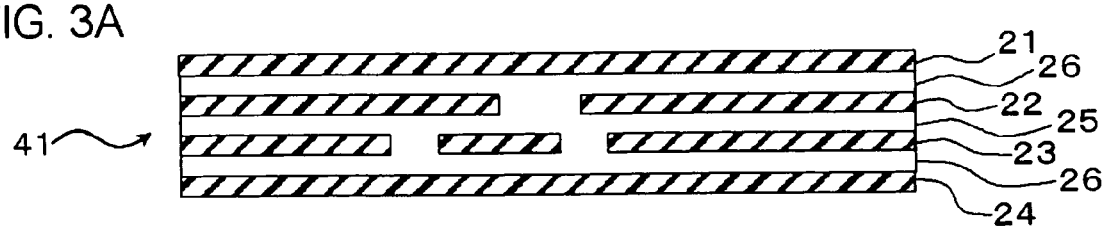
FIGS. 3A to 3D and FIGS. 4A to 4C are sectional views illustrating a series of steps of manufacturing the printed wiring board of the first embodiment.

First, as illustrated in FIG. 3A; a substrate 41 is obtained. The substrate 41 has four metal layers represented by the above-described first layer 21 to fourth layer 24, and the core substrates 25 and prepregs 26 interposed in between. The second layer 22 and the third layer 23 of the substrate 41 are preliminarily patterned in preceding processes.

Figure 3B:
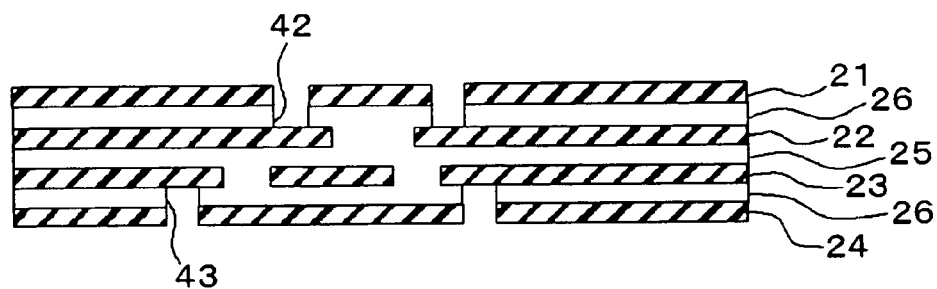

Next, as illustrated in FIG. 3B, laser via holes 42 are formed so as to penetrate through the first layer 21 at predetermined portions, using a micro laser piercing machine (not illustrated). Each laser via hole 42 is formed through the prepreg 26 to a depth enough to reach the second layer 22 laid thereunder. Similarly, the a laser via hole 43 are formed so as to penetrate through the fourth layer 24 and another prepreg 26 at predetermined positions, to a depth enough to reach the third layer 23 laid thereabove.

Figure 3C:
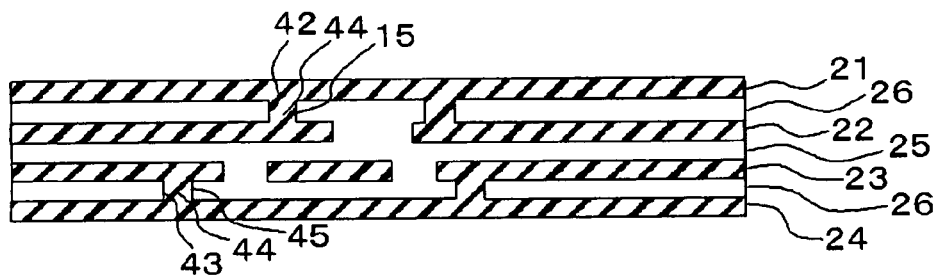

Next, as illustrated in FIG. 3C, a plating 44 is filled in the laser via holes 42 to form the vias. In other words, portions of the plating 44 which extend through the prepreg 26 between the first layer 21 and the second layer 22 compose the vias 15. On the other hand, portions of the plating 44 buried in the first layer 21 compose a part of the lands 2. Similarly, a plating 44 is filled in the laser via holes 43 to form the vias 45. In this way, the first layer 21 and the second layer 22 are electrically connected with each other, and the fourth layer 24 and the third layer 23 are electrically connected with each other. The plating 44 is typically a copper plating.

Figure 3D:
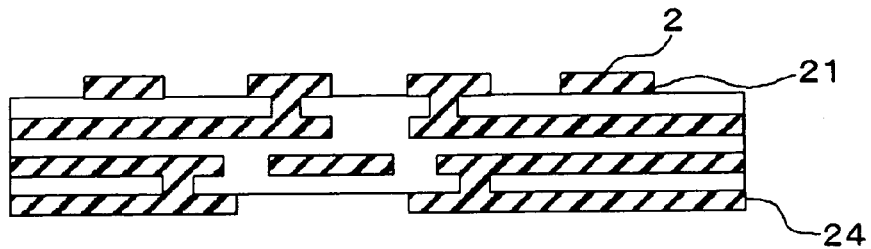

Next, as illustrated in FIG. 3D, the first layer 21 and the fourth layer 24 are respectively processed into predetermined patterns. More specifically, masks having openings according to predetermined patterns are formed independently over the first layer 21 and the fourth layer 24 by photolithography, and the first layer 21 and the fourth layer 24 are then etched through the opening into predetermined patterns. The pattern of the first layer 21 contains the patterns of the lands 2 and the wirings 5, 9.

Figure 4A:
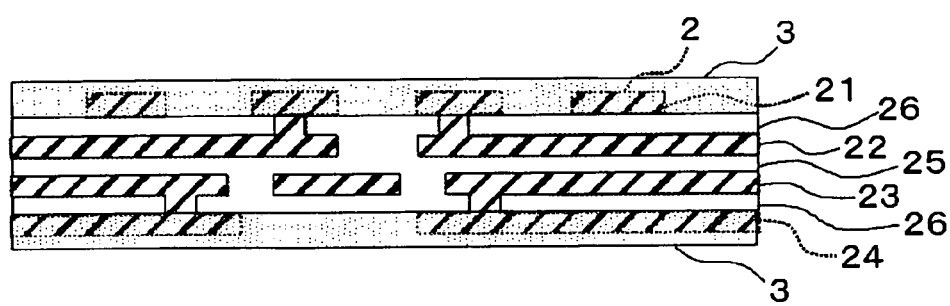

Next, as illustrated in FIG. 4A, a solder resist is coated so as to cover the first layer 21, to thereby form the solder resist layer 3 which covers the entire top surface of the printed wiring board 1 (FIG. 1, FIG. 2). Similarly, the solder resist is coated so as to cover the fourth layer 24, to thereby form the solder resist layer 3 which covers the entire back surface of the printed wiring board 1.

Figure 4B:
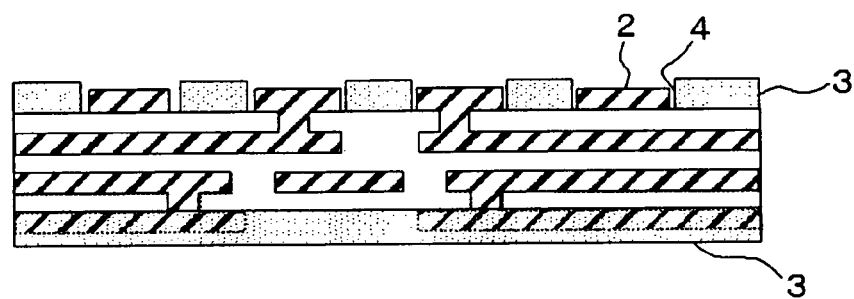

Next, as illustrated in FIG. 4B, the solder resist layer 3 on the top surface is processed by light exposure and development, into a predetermined pattern so as expose the lands 2 and the peripheries thereof. In other words, the solder resist openings 4 and so forth are formed.

Figure 4C:
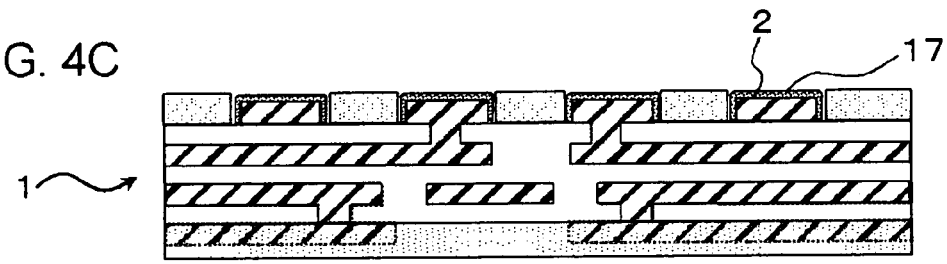

Next, as illustrated in FIG. 4C, the individual lands 2 are subjected to surface treatment. More specifically, the surfaces of the individual lands 2 are typically covered with an electroless plating 17 for the purpose of protection of the exposed lands 2. The electroless plating 17 is typically a Ni/Au plating. The Ni/Au plating is configured by forming a Ni (nickel) plating over the lands 2, and then by forming an Au (gold) plating over the Ni plating.

The printed wiring board 1 may be obtained in this way.

Next, a method for manufacturing a semiconductor device of this embodiment will be explained.

For example, a solder is printed over the lands 2 of the printed wiring board 1, the semiconductor package 31 is placed thereon, and the solder balls 33 on the semiconductor package 31 are allowed to reflow under heating at a temperature not lower than the melting point of the solder, to thereby bond the solder balls 33 to the correspondent lands 2 of the printed wiring board 1. Accordingly, the semiconductor device 30 illustrated in FIG. 2 may be obtained. More specifically, the solder balls 33 in this state are bonded while being fused with the solder (not illustrated) printed over the lands 2, and the individual terminals of the semiconductor chip 31 are connected to the correspondent lands 2, while placing the solder balls 33 and the solder (not illustrated) printed on the lands 2 in between.

Next, operations will be explained.

If the printed wiring board 1, having the semiconductor chip 31 such as a BGA package mounted thereon, is applied with stress (thermal stress or mechanical stress), the stress is concentrated particularly in portions in the vicinity of the land-circumscribing line 10, which represents the boundary between the mounting area 1a and the region outside thereof, and particularly heavily in portions along the outer circumferences of the outermost lands 6. Still more particularly, the stress may heavily be concentrated on the corner lands 7 positioned mostly away from the center of the mounting area 1a.

In this embodiment, each connection portion 11 between each corner land 7 and each wiring 5 falls inside the land-circumscribing line 10. Also each wiring-resist intersection 12 falls inside the land-circumscribing line 10. Accordingly, the wirings 5 may no longer necessarily be disposed at the portion where the thermal stress or mechanical stress may most heavily be concentrated, and thereby the wirings 5 may be suppressed from being damaged (such as causing disconnection of interconnect, or cracking). This is because the mounting area 1a is limited in warping of the printed wiring board 1, by the contribution of the semiconductor chip 31 having a thermal expansion coefficient smaller than that of the printed wiring board 1, and may therefore be applied with a less amount of thermal stress than the portions along the outer circumferences of the outermost lands 6, out of the regions in the vicinity of the land-circumscribing line 10. This is also because the printed wiring board 1, applied with mechanical stress such as warping, may warp around the land-circumscribing line 10 assumed as a line of support, so as to concentrate the stress in the portions along the outermost lands 6, but the warping of the printed wiring board 1 may be limited in the mounting area 1a by the contribution of the semiconductor chip 31, so that the mounting area 1a may consequently be applied with a less amount of mechanical stress than the portions along the outer circumferences of the outermost lands 6, among the regions in the vicinity of the land-circumscribing line 10.

According to the first embodiment as described in the above, since the printed wiring board 1 has a plurality of lands 2 arranged in the mounting area 1a allowing therein mounting of the semiconductor chip 31 (FIG. 2), and the wiring 5 respectively connected to the corner lands 7, and since the connection portions 11 of the corner lands 7 and the wirings 5 connected to the corner lands 7 fall inside the land-circumscribing line 10 which collectively surrounds, by the shortest path, all outermost lands 6 formed in the mounting area 1a, so that the wirings 5 may no longer necessarily be disposed at the portion where the thermal stress or mechanical stress may most heavily be concentrated. Accordingly, the wirings 5 connected to the corner lands 7 may be suppressed from being damaged (such as causing disconnection of interconnect, or cracking).

The wirings 5 connected to the corner lands 7 may be suppressed from being damaged, also because the wiring-resist intersections 12 of the wirings 5 connected to the corner lands 7 are positioned inside the land-circumscribing line 10.

Each wiring 5 connected to each corner land 7 is specifically routed so as to run between the corner land 7 to which the wiring 5 is connected and the outermost land 6 adjacent to the corner land 7, and to extend outward beyond the land-circumscribing line 10. For more details, the wiring 5 is routed typically so as to originate from the connection portion 11, to run once in the direction away from the land-circumscribing line 10, to be folded back, to run through a gap 14 between the corner land 7 and the outermost land 6 adjacent to the corner land 7, and to extend outward beyond the land-circumscribing line 10. In other words, wirings 5 are routed across the land-circumscribing line 10, but are routed away from the portions along the outer circumference of the outer most land 6 out of the portions in the vicinity of the land-circumscribing line 10, so that the wirings 5 may be suppressed from being damaged. The wirings 5 may be suppressed from being damaged, also by the contribution of a fact that the portions of the wirings 5 across the land-circumscribing line 10 are covered with the solder resist layer 3.

The outermost lands 6 other than the corner lands 7 are connected to the vias 15, and also the internal wirings 16 positioned lower than the outermost lands 6 are connected to the vias 15. The displacement of the printed wiring board 1 due to stress-induced warping is smaller in the depth-wise center portion thereof, than in the surficial portion thereof. Since the internal wirings 16 are positioned below the lands 2 which serve as the connection portions between the semiconductor package 31 and the printed wiring board 1, so that the displacement of the printed wiring board 1 due to stress-induced warping may be smaller than in the case where the wirings are positioned in the surficial layer (in the same layer with the lands 2). In addition, the internal wirings 16 are covered with the solder resist layer 3 and the prepreg 26. Accordingly, the internal wirings 16 may be suppressed from being damaged, even when the printed wiring board 1 is applied with the stress.

[Second Embodiment]

Figure 5:
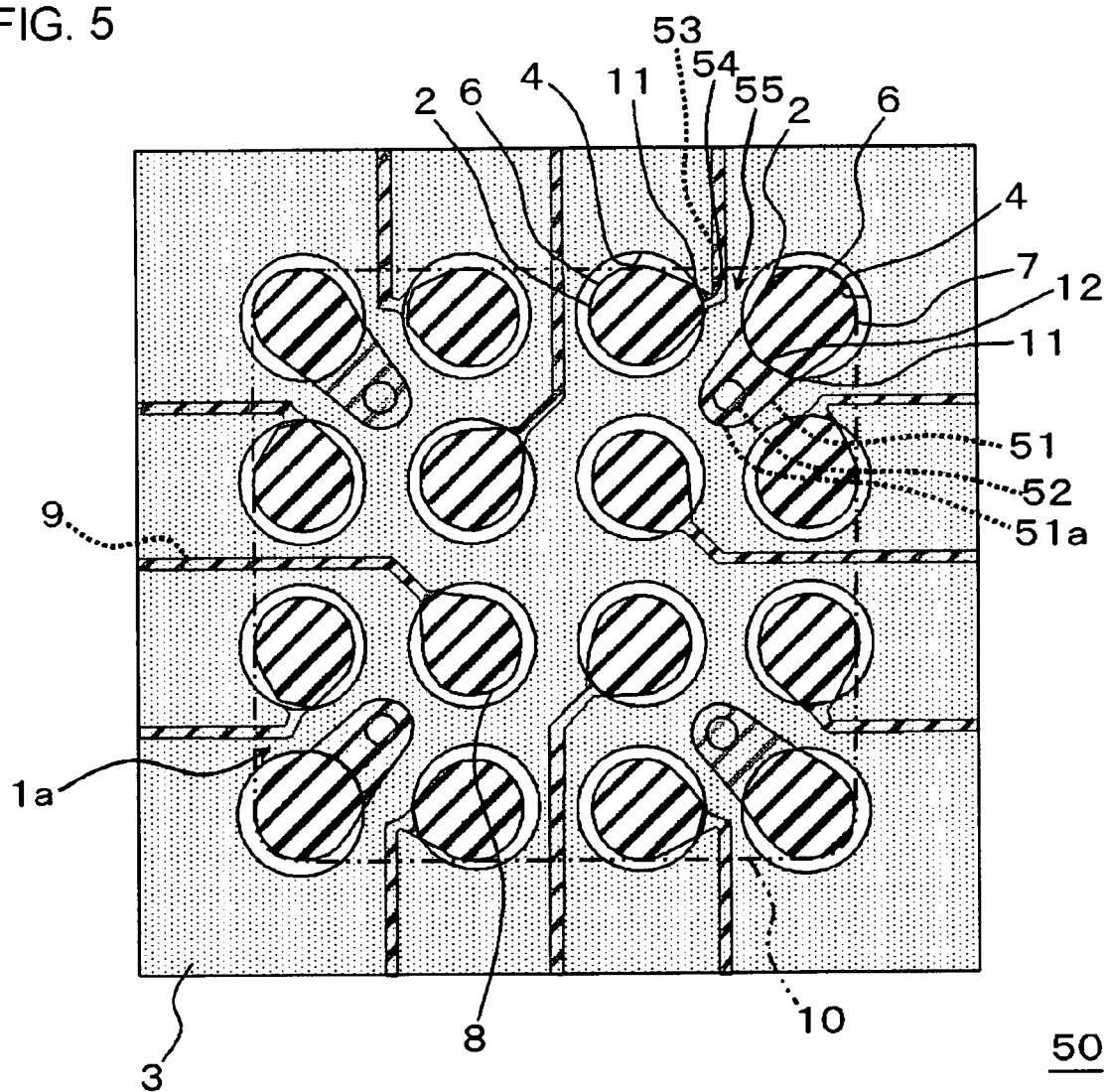
FIG. 5 is a plan view illustrating a printed wiring board of a second embodiment.

FIG. 5 is a plan view of a printed wiring board 50 of a second embodiment, and illustrates the mounting area 1a allowing therein mounting of a BGA package or an LGA package as the semiconductor chip, and the portions therearound.

The printed wiring board 50 of this embodiment is configured similarly to the printed wiring board 1 of the first embodiment, except for the points explained below.

First, the printed wiring board 50 has no internal wirings 16 nor vias 15, instead wirings 53 are connected to the outermost lands 6 other than the corner lands 7.

Connection portions 11 between the outermost lands 6 other than the corner lands 7 and the wirings 53 are positioned inside the land-circumscribing line 10. Each connection portion 11 between each outermost land 6 other than the corner lands 7 and each wiring 53 is positioned typically on the outer circumference of the outermost land 6, at a portion thereof faced to the adjacent outermost land (corner land 7, for example).

The wiring 53 is extend outward beyond the land-circumscribing line 10, while being routed so that an wiring-resist intersection 54, where the wiring 53 crosses the inner circumference of the solder resist opening 4 corresponded to the outermost land 6 to which the wiring 53 is connected, falls inside the land-circumscribing line 10. More specifically, the wiring 53 is routed so as to run through a gap 55 (and preferably the center thereof) between the outermost land 6 to which the wiring 53 is connected and the adjacent outermost land 6 (corner land 7, for example).

In this embodiment, each corner land 7 has no wiring 5 connected thereto, but instead has an wiring 51 connected thereto. The route of each wiring 51 is similar to the route of the wiring 5 from the connection portion 11 to the folded portion 13 in the first embodiment. Accordingly, the entire portion of the wiring 51 falls inside the land-circumscribing line 10. The wiring 51 typically has a width nearly equal to the diameter of the corner land 7 at the connection portion 11, and is narrowed towards the end 51a. Each wiring 51 is connected, at around the end 51a thereof, to a via 52. In other words, the portion around the end 51a of each wiring 51 configures a via land. Each via 52 is further connected with an unillustrated internal wiring similar to the internal wiring 16 illustrated in FIG. 1. In other words, the via 52 is connected with the internal wiring positioned lower than the corner land 7.

In this embodiment, all outermost lands 6 including the corner lands 7 represent the specific lands.

According to the above-described second embodiment, effects similar to those in the above-described first embodiment may be obtained, with respect to the wiring 53 connected to the outermost lands 6 other than the corner lands 7, and also with respect to the wirings 51 connected to the corner lands 7.

Since the via 52 is connected to the wiring 51 rather than the land 2, so that it is no longer necessary to pierce the land 2 to form the via. Accordingly, there is no need of using an expensive micro laser piercing machine, and thereby cost of manufacturing the printed wiring board 50 may be reduced as compared with the first embodiment. While the vias 15 in the above-described first embodiment were connected to all outermost lands 6 other than the corner lands 7, the vias 52 in this embodiment are connected only to the wiring 51 which are connected to the corner lands 7, so that this embodiment needs a smaller number of vias to be formed as compared with the first embodiment (for example, the first embodiment needs the vias for each of eight lands 2, whereas the second embodiment needs vias for each of four wirings 51).

In the above-described embodiments, each of the printed wiring boards 1, 50 may have a single mounting area 1a, or may have two or more mounting areas 1a. Each mounting area 1a may have a plurality of lands 2 formed therein.

While the above-described embodiments dealt with the case where each of the printed wiring boards 1, 50 had the mounting area 1a only on one surface thereof, and a plurality of lands 2 formed in the mounting area 1a, each of the printed miring board 1, 50 may alternatively have a mounting area 1a on each of the top and back surfaces thereof, and a plurality of lands 2 may be formed in each mounting area 1a.

While the above-described first embodiment dealt with the exemplary case where the internal wirings 16 were connected to the outermost lands 6 other than the corner lands 7, also the wirings connected to the outermost lands 6 other than the corner lands 7 may alternatively be routed similarly to the wirings 5 connected to the corner lands 7. More specifically, each wiring connected to the outermost land 6 other than the corner land 7 may be routed typically so as to originate from the connection portion, to run once in the direction away from the land-circumscribing line 10, to be folded back at the folded portion, to run through a gap (and preferably the center thereof) between the outermost land 6 and the adjacent outermost land 6 (corner land 7, for example), and to extend outward beyond the land-circumscribing line 10.

Alternatively, in the first embodiment, the outermost lands 6 other than the corner lands 7 may be connected with the wirings 53 described in the second embodiment.

Still alternatively, the corner lands 7 may sequentially be connected with the wirings 51, the vias 52 and the internal wirings as described in the second embodiment, and the outermost lands 6 other than the corner lands 7 may sequentially be connected with the vias 15 and the internal wirings 16 as described in the first embodiment.

While the above-described embodiments dealt with the case where the semiconductor package 31, as the electronic component, was mounted on the mounting area 1a of the printed wiring board 1, an unpackaged semiconductor chip may alternatively be mounted in place of the semiconductor package 31. Still alternatively, an electronic component other than the semiconductor package 31 or the semiconductor chip (capacitor, for example) may be mounted.

It is apparent that the present invention is not limited to the above embodiments, that may be modified and changed without departing from the scope and spirit of the invention.

What is claimed is:

1. A printed wiring board comprising:
   a plurality of lands arranged in a mounting area allowing therein mounting of an electronic component; and
   an wiring respectively connected to a specific land which is at least one of the outermost lands arranged outermostly out of said lands,
   a connection portion of said specific land and said wiring connected to said specific land is positioned inside a closed curve which collectively surrounds, by the shortest path, all of said outermost lands formed in said mounting area.

2. The printed wiring board according to claim 1,
   further comprising a solder resist layer over the surface thereof,
   wherein said solder resist layer has openings respectively formed so as to be positioned at said individual lands and to have larger diameter than said individual lands, and
   an intersection of said wiring connected to said specific land, and the inner circumference of each opening corresponded to the said specific land, is positioned inside said closed curve.

3. The printed wiring board according to claim 1, further comprising:
   a via connected to a second specific land which is at least one of the outermost lands but other than said specific land; and
   a internal wiring positioned lower than said second specific land, and is connected to said via.

4. The printed wiring board according to claim 1,
   wherein said wiring connected to at least one of said specific land is routed so as to run between said specific land and the adjacent one of said outermost lands, and to extend outward beyond said closed curve.

5. The printed wiring board according to claim 1,
   wherein said wiring connected to at least one of said specific land is routed so as to originate from said connection portion, to run once in the direction away from said closed curve, to be folded back, to run between said specific land and the adjacent one of said outermost lands, and to extend outward beyond said closed curve.

6. The printed wiring board according to claim 1,
   wherein said wiring connected to at least one of said specific land is positioned so that the entire portion thereof falls inside said closed curve, and
   said printed wiring board further comprises a via connected to said wiring, and a internal wiring positioned lower than said at least one of specific land, and is connected to said via.

7. The printed wiring board according to claim 1,
   wherein said specific land contains at least an outermost land disposed at a corner, out of said outermost lands.

8. A semiconductor device comprising:
   a printed wiring board including:
      a plurality of lands arranged in a mounting area allowing therein mounting of an electronic component; and
      an wiring respectively connected to a specific land which is at least one of the outermost lands arranged outermostly out of said lands,
      a connection portion of said specific land and said wiring connected to said specific land is positioned inside a closed curve which collectively surrounds, by the shortest path, all of said outermost lands formed in said mounting area; and
   a semiconductor chip or a semiconductor package as said electronic component connected to said plurality of lands in said mounting area.

9. A method for manufacturing a printed wiring board, comprising:
   forming a plurality of lands on a printed wiring board arranged in a mounting area allowing therein mounting of an electronic component, and
   forming an wiring respectively connected to a specific land which is at least one of the outermost lands arranged outermostly out of said lands,
   wherein said forming an wiring, said wiring is formed so that a connection portion of said specific land and said wiring connected to said specific land is positioned inside a closed curve which collectively surrounds, by the shortest path, all of said outermost lands formed in said mounting area.

* * * * *